(12) United States Patent
Vatus et al.

(10) Patent No.: US 8,512,472 B2
(45) Date of Patent: Aug. 20, 2013

(54) METHOD AND APPARATUS TO ENHANCE PROCESS GAS TEMPERATURE IN A CVD REACTOR

(75) Inventors: Jean R. Vatus, San Jose, CA (US); Kailash Kiran Patalay, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1315 days.

(21) Appl. No.: 12/270,590

(22) Filed: Nov. 13, 2008

(65) Prior Publication Data

US 2010/0120259 A1    May 13, 2010

(51) Int. Cl.
*C23C 16/00* (2006.01)
(52) U.S. Cl.
USPC ...... 118/715; 118/724; 118/725; 156/345.33; 156/345.34
(58) Field of Classification Search
USPC ............... 118/715, 724, 725; 156/345.33; 156/345.34
See application file for complete search history.

(56) References Cited

U.S. PATENT DOCUMENTS

| | | | |
|---|---|---|---|
| 4,533,410 A * | 8/1985 | Ogura et al. | 117/99 |
| 4,846,102 A | 7/1989 | Ozias | |
| 5,520,742 A * | 5/1996 | Ohkase | 118/724 |
| 5,525,157 A | 6/1996 | Hawkins et al. | |
| 6,093,252 A * | 7/2000 | Wengert et al. | 118/719 |
| 2002/0004309 A1* | 1/2002 | Collins et al. | 438/719 |

FOREIGN PATENT DOCUMENTS

| | | | |
|---|---|---|---|
| JP | 63-316425 | * | 12/1988 |
| WO | 8912703 A1 | | 12/1989 |

\* cited by examiner

*Primary Examiner* — Jeffrie R Lund
*Assistant Examiner* — Satish Chandra
(74) *Attorney, Agent, or Firm* — Moser Taboada; Alan Taboada

(57) ABSTRACT

Methods and apparatus for controlling temperature and flow characteristics of process gases in a process chamber have been provided herein. In some embodiments, an apparatus for controlling temperature and flow characteristics of a process gas in a process chamber may include a gas pre-heat ring configured to be disposed about a substrate and having a labyrinthine conduit disposed therein, wherein the labyrinthine conduit has an inlet and outlet to facilitate the flow of the process gas therethrough.

14 Claims, 5 Drawing Sheets

US 8,512,472 B2

METHOD AND APPARATUS TO ENHANCE PROCESS GAS TEMPERATURE IN A CVD REACTOR

FIELD

Embodiments of the present invention generally relate to semiconductor processing and more particularly, to methods and apparatus for controlling temperature and flow characteristics of process gases in a process chamber.

BACKGROUND

Continuous reduction in size of semiconductor devices is dependent upon more precise control of, for instance, the flow and temperature of process gases delivered to a semiconductor process chamber. Typically, in a cross-flow process chamber, a process gas may be delivered to the chamber and directed across the surface of a substrate to be processed. The temperature of the process gas may be controlled by, for example, a pre-heat ring, which surrounds the substrate support.

Controlling flow characteristics and temperature of process gases is critical to obtain, for example, uniform deposition of a layer atop a substrate. Unfortunately, a process gas entering conventional cross-flow process chambers is typically not heated uniformly. In some instances, the chamber walls may act as a heat sink, thus reducing effectiveness of, for example, the pre-heat ring in uniformly heating the process gas prior to deposition on the substrate. Further, the flow direction and velocity of the process gas may be non-uniform proximate the substrate edge. Consequently, these non-uniform temperature and flow characteristics result in non-uniform deposition of a layer proximate the substrate edge.

Accordingly, there is a need in the art for a processing apparatus having improved control of temperature and flow characteristics of a process gas.

SUMMARY

Methods and apparatus for controlling temperature and flow characteristics of process gases in a process chamber have been provided herein. In some embodiments, an apparatus for controlling temperature and flow characteristics of a process gas in a process chamber may include a gas pre-heat ring configured to be disposed about a substrate and having a labyrinthine conduit disposed therein, wherein the labyrinthine conduit has an inlet and outlet to facilitate the flow of the process gas therethrough.

In some embodiments, an apparatus for processing a semiconductor substrate may include a process chamber having a substrate support disposed therein; and a gas pre-heat ring disposed about the substrate support and having a labyrinthine conduit disposed therein, wherein the labyrinthine conduit has an inlet and outlet to facilitate the flow of a process gas therethrough.

In some embodiments, a method for processing a substrate may include providing a process chamber having a substrate support pedestal with a substrate disposed thereon and having a gas pre-heat ring disposed about the substrate support pedestal to heat a process gas flowing therethrough, wherein the gas pre-heat ring has a labyrinthine conduit disposed therein; flowing a process gas through the labyrinthine conduit of the pre-heat ring; and flowing the process gas from the labyrinthine conduit across a surface of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

Figure 1:
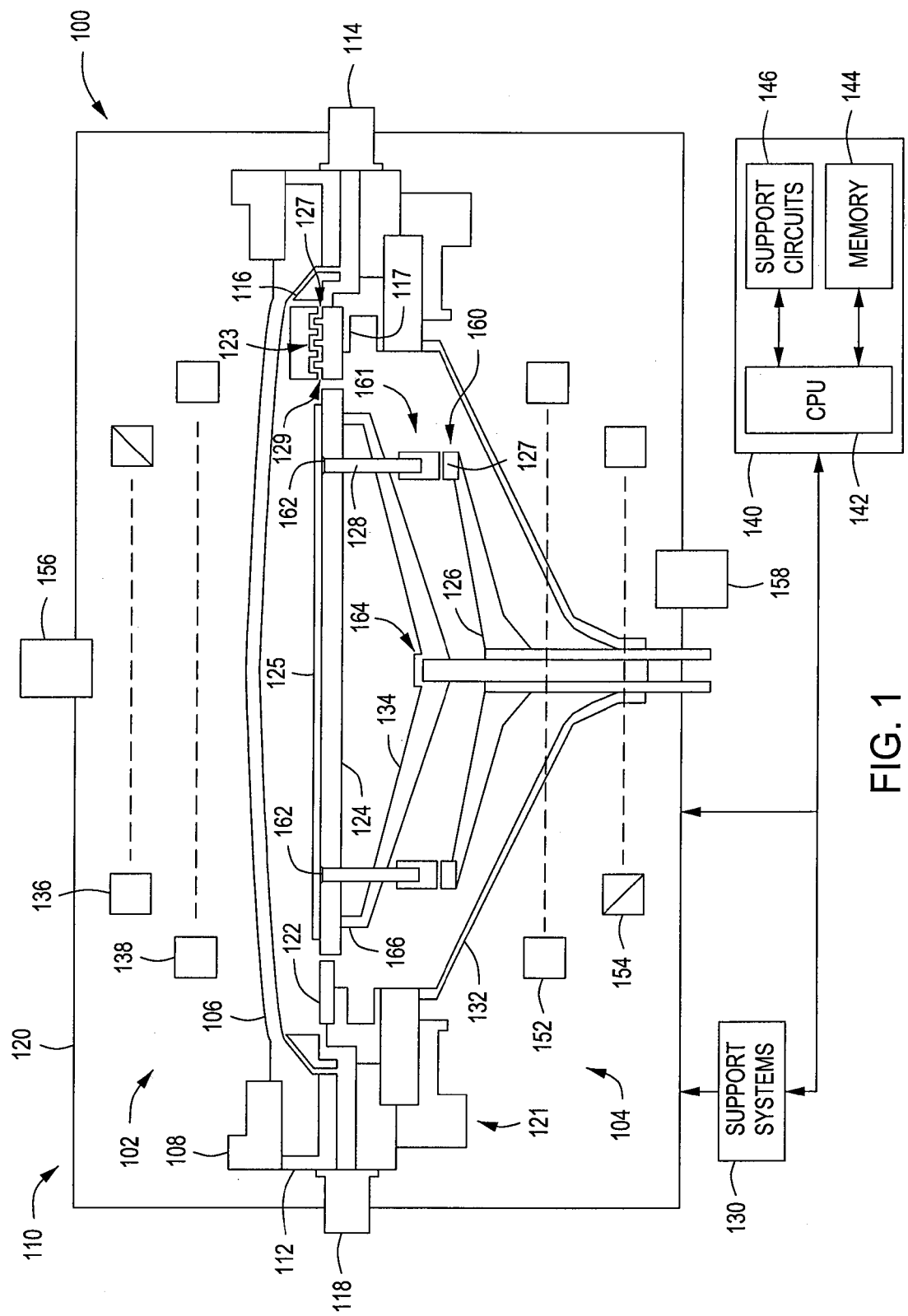
FIG. 1 depicts a schematic side view of a process chamber in accordance with some embodiments of the present invention.

Methods and apparatus for controlling temperature and flow characteristics of process gases in a process chamber are provided herein. In some embodiments, the apparatus include a gas pre-heat ring configured to be disposed about a substrate and having a labyrinthine conduit disposed therein. The labyrinthine conduit has an inlet and outlet to flow a process gas therethrough, thereby increasing the residence time of the gas flowing within the gas pre-heat ring. The inventive methods and apparatus advantageously improve temperature uniformity and flow characteristics of a process gas being delivered to a substrate surface, thereby facilitating more uniform deposition of a layer atop the substrate surface.

The inventive methods and apparatus disclosed herein may be utilized in any suitable semiconductor process chamber adapted for performing chemical vapor deposition, such as epitaxial deposition processes. A non-limiting example of one suitable semiconductor process chamber is the RP EPI reactor, available from Applied Materials, Inc. of Santa Clara, Calif. An exemplary process chamber is described below with respect to FIG. 1, which depicts a schematic, cross-sectional view of a semiconductor substrate process chamber 100 suitable for performing portions of the present invention. The process chamber 100 may be adapted for performing epitaxial silicon deposition processes and illustratively comprises a chamber body 110, support systems 130, and a controller 140.

The chamber body 110 generally includes an upper portion 102, a lower portion 104, and an enclosure 120. The upper portion 102 is disposed on the lower portion 104 and includes a lid 106, a clamp ring 108, a liner 116, a baseplate 112, one or more upper lamps 136 and one or more lower lamps 138, and an upper pyrometer 156. In one embodiment, the lid 106 has a dome-like form factor, however, lids having other form factors (e.g., flat or reverse curve lids) are also contemplated.

The lower portion 104 is coupled to a process gas intake port 114 and an exhaust port 118 and comprises a baseplate assembly 121, a lower dome 132, a substrate support 124, a gas pre-heat ring 122, a substrate lift assembly 160, a substrate support assembly 164, one or more upper lamps 152 and one or more lower lamps 154, and a lower pyrometer 158. Although the term "ring" is used to describe certain components of the process chamber, such as the gas pre-heat ring 122, it is contemplated that the shape of these components need not be circular and may include any shape, including but not limited to, rectangles, polygons, ovals, and the like.

The gas pre-heat ring 122 is configured to be disposed about the substrate support 124 and facilitates pre-heating a process gas flowed therethrough. For example, gas pre-heat ring 122 may be fabricated from any suitable material for absorbing energy from a lamp (such as lamps 136, 138) and for heating the process gas flowing therethrough. In some embodiments, the gas pre-heat ring 122 may comprise at least one of quartz, silicon carbide, graphite coated with silicon carbide, or the like. In some embodiments, the gas pre-heat ring 122 comprises graphite coated with silicon carbide.

Figure 2A:
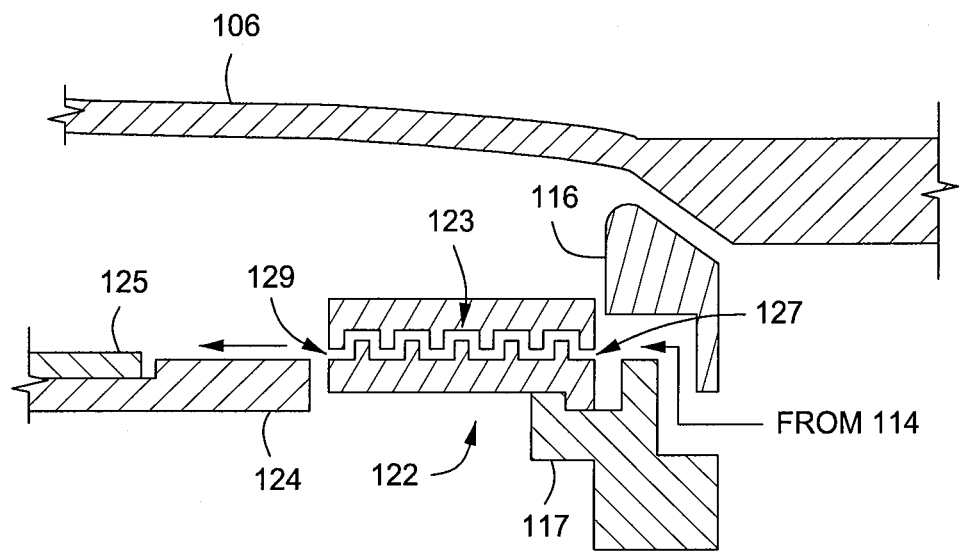
FIGS. 2A-B depict cross sectional side views of embodiments of a gas pre-heat ring in accordance with some embodiments of the present invention.
Figure 2B:
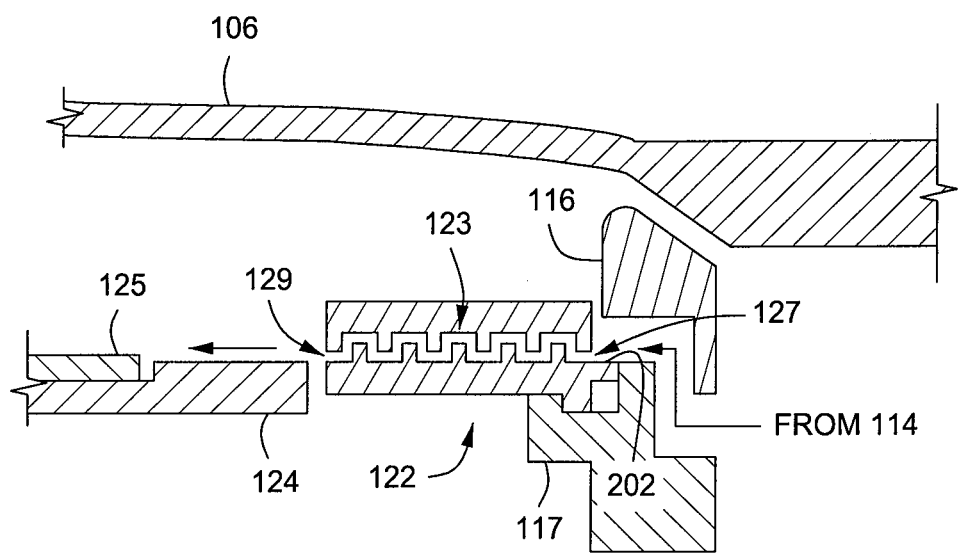

The gas pre-heat ring 122 has a labyrinthine conduit 123 disposed therein. The labyrinthine conduit 123 facilitates control of the flow direction, flow velocity, and/or temperature of a process gas flowing therethrough. For example, as depicted in FIG. 1, and in a more detailed view in FIG. 2A, the labyrinthine conduit 123 has an inlet 127 and an outlet 129 for facilitating the flow of the process gas therethrough. The process gas may enter the inlet 127 from a process gas intake port 114 and may exit the outlet 129 proximate an edge of the substrate support 124. The labyrinthine conduit 123 provides a path between the inlet 127 and the outlet 129 having an increased length as compared to a direct line. Although depicted in FIG. 1 as a vertical comb-like configuration, any suitable extended, or torturous path that increases residence time of a process gas within the labyrinthine conduit 123, and/or maximizes surface contact of the process gas with the walls of the labyrinthine conduit 123 can be utilized. The gas pre-heat ring 122 may be supported in the process chamber by a support 117 that supports and positions the gas pre-heat ring 122 such that the outlet 129 directs process gases across an upper surface of the substrate support 124. In some embodiments, for example as depicted in FIG. 2B, at least a portion of the gas pre-heat ring 122 may have a lip 202 extending radially outwards therefrom, for example at least proximate the inlet 127, to provide a level surface for the gases entering the labyrinthine conduit 123 from the process gas intake port 114.

Figure 3:
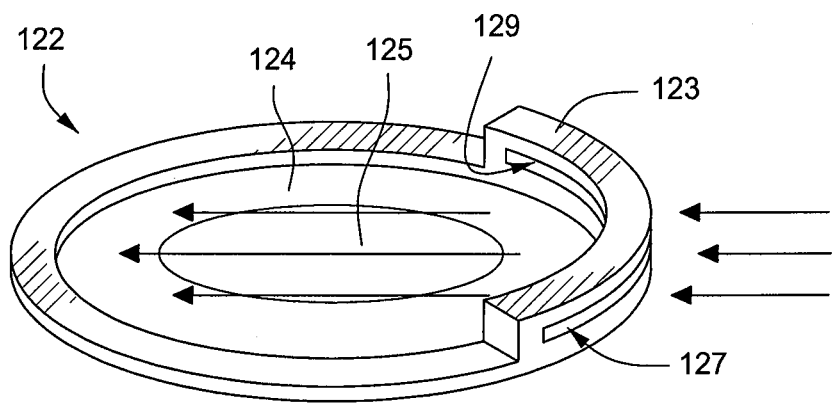
FIG. 3 depicts a perspective view of a gas pre-heat ring in accordance with some embodiments of the present invention.

FIG. 3 depicts a perspective view of the gas pre-heat ring 122 in accordance with some embodiments of the present invention. The gas pre-heat ring 122 may be disposed about a substrate support 124 supporting a substrate 125 thereupon. Process gases, as depicted by arrows, may enter the labyrinthine conduit 123 of the gas pre-heat ring 122 and may be advantageously heated to a temperature higher than if the process gases traveled directly through or over the gas pre-heat ring (as conventionally done).

Figure 4:
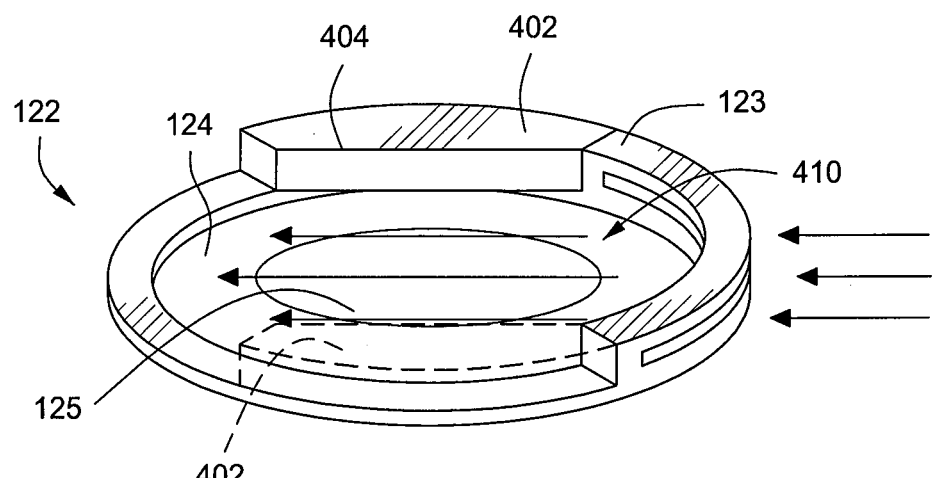
FIG. 4 depicts a perspective view of a gas pre-heat ring in accordance with some embodiments of the present invention.
Figure 5:
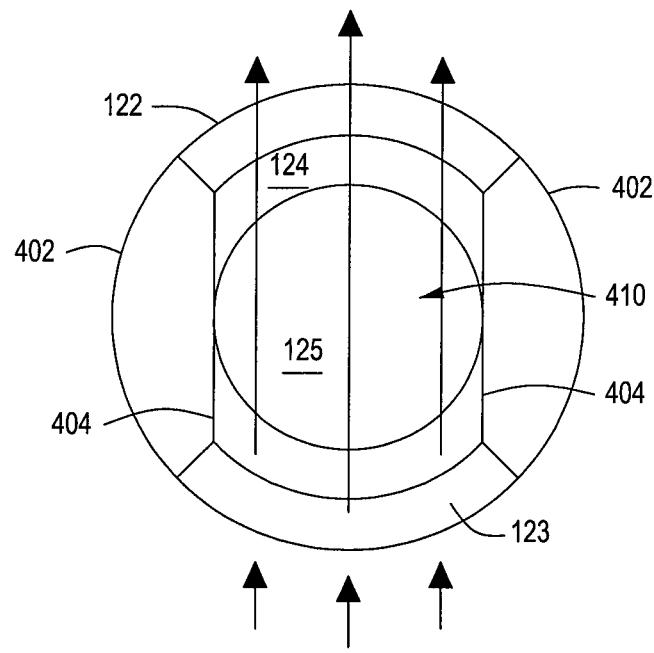
FIG. 5 depicts a schematic top view of a gas pre-heat ring in accordance with some embodiments of the present invention.

As can be seen in FIG. 3, the process gases flowing over the substrate 125 are not laterally constrained and also may flow over the surface of the substrate support 124 on either side of the substrate 125. Accordingly, in some embodiments, and as depicted in FIGS. 4 and 5, the gas-preheat ring 122 may be configured to define a channel 410 having a width proximate to, or substantially equal to, the width, or diameter, of the substrate 125. Such a channel 410 may laterally constrain the process gases flowing over the surface of the substrate 125 to provide a more uniform directional flow. The more uniform directional flow facilitates improved uniformity in a layer deposited atop the substrate 125.

In some embodiments, one or more inserts 402 may be provided to define the channel 410. The one or more inserts 402 may rest upon the gas pre-heat ring 122 or may be otherwise supported in a desired position. The one or more inserts 402 may have inner surfaces 404 that define the width of the channel 410 therebetween. For example, the one or more inserts 402 may be disposed above the substrate surface 125 on opposite sides thereof. The inner surface 404 of each insert 402 may be a linear edge configured to be disposed in an area above the substrate 125 corresponding to an edge of the substrate 125. For example, the inner surface 404 may be oriented tangentially with respect to the peripheral edge of the substrate 125, as illustrated in FIGS. 4 and 5. Inserts 404 having different shapes than that shown in FIGS. 4 and 5 may also be provided to define the channel 410. Alternatively, the inserts 402 may be replaced by fabricating the gas pre-heat ring 122 in a desired equivalent geometry having the channel 410 defined thereby.

The channel 410, for example defined at least in part by the one or more inserts 402, may constrain the flow direction of process gases over the substrate 125 to be substantially linear. The channel 410, for example defined at least in part by the one or more inserts 402, may also facilitate more uniform flow velocity of process gases over the substrate 125 proximate edges of each insert 402 and along interior portions of the substrate surface.

The one or more inserts 402 may also facilitate more uniform heating of a process gas proximate the substrate surface. For example, each insert 402 may be fabricated, at least in part, from a material that is capable of absorbing light energy and/or radiating heat from the absorbed light energy. The light energy may be incident on each insert 402 from one or more of the lamps 136, 138, 152, and 154. As such, the one or more inserts 402 may radiate heat, thereby facilitating maintaining the temperature of the process gases and/or providing improved temperature control of the process gases proximate the substrate surface. In some embodiments, the insert 402 may be fabricated from similar materials as discussed above with respect to the gas pre-heat ring 122. In some embodiments, each insert comprises quartz.

Figure 6:
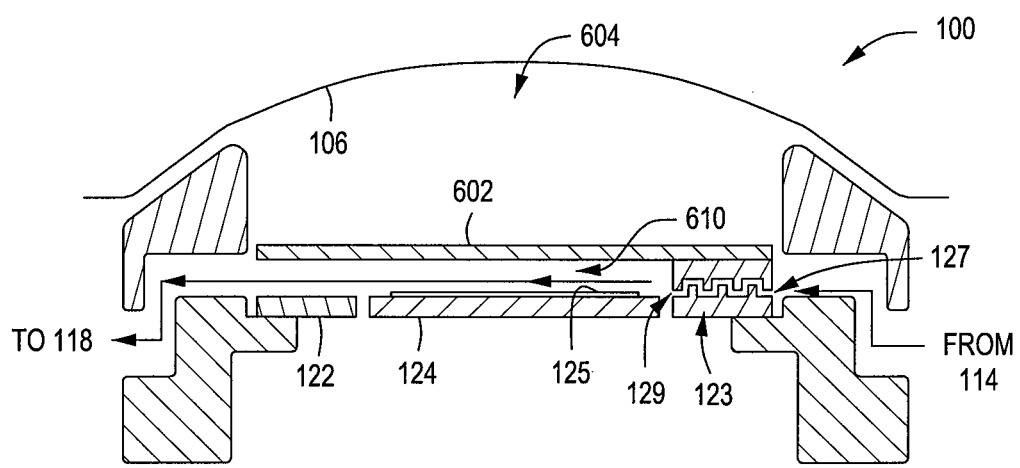
FIG. 6 depicts a schematic side view of a gas pre-heat ring in accordance with some embodiments of the present invention.

In some embodiments, alternatively or in combination with inserts 402, a flow channel may further be defined by a cap 602 disposed above the substrate 125 that constrains the flow of process gases flowing thereover. For example, as depicted in FIG. 6, a channel 610 may be at least partially defined by a cap 602 disposed over the substrate 125. In some embodiments, the channel 610 may be about 0.2 to about 1 inch high. In some embodiments, the cap 602 may be configured to be disposed over the entire substrate support 124 or at least portions of the gas pre-heat ring 122 (as depicted in FIG. 6). The cap 602 may be utilized alone, as illustrated, or may be utilized in combination with the one or more inserts 402. The cap 602 may be of any suitable shape including a circle, square, rectangular, or the like. The cap 602 may be of any suitable thickness to prevent sagging of the cap 602 over the substrate 125. In some embodiments, the cap 602 may be substantially circular with dimensions similar to the gas pre-heat ring 122 to facilitate being supported thereby. Alternatively, the cap 602 may be coupled to the process chamber 100 in any suitable manner which does not interfere with operation of the chamber.

The cap 602 may be utilized to control the flow direction, velocity, and/or temperature of process gases flowing from the outlet 129 of the labyrinthine conduit 123. For example, the cap 602 prevents the process gases from flowing into an upper volume 604 in the process chamber 100 and facilitates flowing the process gases substantially parallel to the surface of the substrate 125, as illustrated in FIG. 6 by arrows.

The cap 602 may be fabricated, at least in part, from a material that is capable of absorbing light energy and/or radiating heat resultant from the absorbed light energy. Light energy may be incident on the plate from one or more of the lamps 136 and 138. As such, the cap 602 may radiate heat, thereby facilitating more uniform temperature of the process gases and/or improved temperature control of the process gases proximate the substrate surface. For example, the lid 106 of the process chamber 100 may act as a heat sink, thereby undesirably removing heat from the process gases. The cap 602 facilitates providing a source of heat proximate the process gases that can help maintain the temperature of the process gases flowing across the substrate 125. The cap 602 may be fabricated from the same materials as described above for the gas pre-heat ring 122.

Returning to FIG. 1, during processing, a substrate 125 is disposed on the substrate support 124. The lamps 136, 138, 152, and 154 are sources of infrared (IR) radiation (i.e., heat) and, in operation, generate a pre-determined temperature distribution across the substrate 125. The lid 106, the clamp ring 116, and the lower dome 132 are formed from quartz; however, other IR-transparent and process compatible materials may also be used to form these components. In some embodiments, the one or more of the upper lamps 152, the upper lamps 136 and one or more of the lower lamps 154, the lower lamps 138 may be utilized to heat the pre-heat ring 122. In some embodiments, one or more of the above mentioned lamps may be used to heat the one or more inserts 402 and the cap 602. In some embodiments, a thermocouple or a dedicated pyrometer (not shown) may be disposed proximate to one or more of the gas pre-heat ring 122, the one or more inserts 402, or the cap 602 to provide temperature data corresponding to each element. In some embodiments, the temperature data may be fed to a controller (such as the controller 140, discussed below) to actively control the temperature of each element via a feedback control loop.

The substrate support assembly 164 generally includes a support bracket 134 having a plurality of support pins 166 coupled to the substrate support 124. The components of the substrate support assembly 164 may be fabricated from any of the materials discussed above for the gas pre-heat ring 122. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion of the lift pin 128 is movably disposed through a first opening 162 in the substrate support 124. In operation, the substrate lift shaft 126 is moved to engage the lift pins 128. When engaged, the lift pins 128 may raise the substrate 125 above the substrate support 124 or lower the substrate 125 onto the substrate support 124.

The support systems 130 include components used to execute and monitor pre-determined processes (e.g., growing epitaxial silicon films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 generally comprises a central processing unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems. Instructions resident in memory 144 or otherwise accessible to the CPU 142 may be executed to control the operation of the process chamber in accordance with the teachings disclosed herein.

Figure 7:
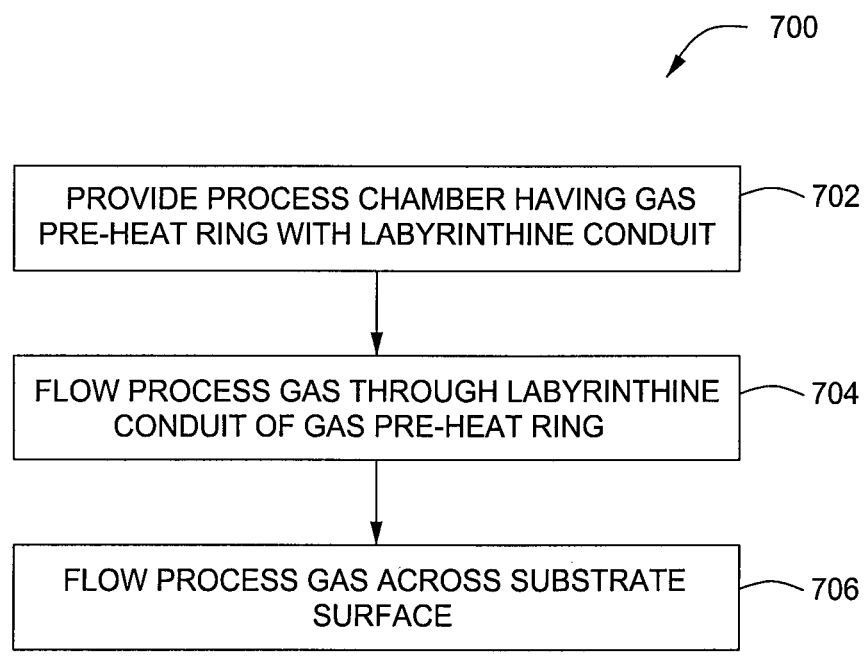
FIG. 7 depicts a flow chart of a method for processing a substrate in accordance with some embodiments of the present invention.

For example, FIG. 7 illustrates a flow chart of a method 700 for processing a substrate a substrate. The method 700 may be performed in a deposition chamber, such as the process chamber 100 described above with respect to FIG. 1. The method 700 is described below with respect to FIGS. 1-6.

The method 700 begins at 702 by providing a process chamber having a gas pre-heat ring with a labyrinthine conduit disposed therein. For example, the process chamber 100 may be provided with the gas pre-heat ring 122 and labyrinthine conduit 123. In some embodiments, the process chamber 100 may further include at least one of the one or more inserts 402 or the cap 602 to further control flow and/or temperature characteristics of process gases flowing across the surface of a substrate 125. The process gases may be utilized to deposit a layer atop the substrate 125, for example in a chemical vapor deposition (CVD) process. The process gases enter the chamber 100 via the gas intake port 114 and are directed to the inlet 127 of the labyrinthine conduit 123.

Next, at 704, the process gases are flowed through the labyrinthine conduit 123 of the gas pre-heat ring 122. The process gases may be any suitable process gas, such as one or more precursor gases for a deposition process, such as an epitaxial silicon deposition process. Examples of suitable precursor gases include one or more of silane, dichlorosilane, or the like. In some embodiments, a cleaning gas may be flowed through the labyrinthine conduit 123 to facilitate cleaning thereof. The process gases flow through the labyrinthine conduit 123, thereby increasing the residence time of the process gases within the gas pre-heat ring 122 and/or the surface contact of the process gases with the walls of the labyrinthine conduit 123. In some embodiments, the process gases may activated to form a reactive species by the heating process.

The process gases may be heated within the labyrinthine conduit 123 due to the heating of the labyrinthine conduit 123 with one or more of the lamps 136, 138, 152 or 154. In some embodiments, the labyrinthine conduit 123 is heated by the lamps 136 and/or 138. Flowing the process gases through the labyrinthine conduit 123 raises the temperature of the process gases as compared to directly flowing the process gases through or over the gas pre-heat ring. Moreover, in embodiments where the one or more inserts 402 and/or the cap 602 are utilized, the temperature of the process gases may further be maintained and/or raised while flowing over the substrate 125, thereby facilitating more uniform processing as well as enhanced processing due to increased activation of the process gases.

At 706, the process gases exit the labyrinthine conduit 123 at the outlet 129 and may flow substantially parallel to (across) the surface of the substrate 125. In some embodiments, process gases exiting the labyrinthine conduit 123 may have decreased flow velocity proximate the peripheral edge of the substrate 125. As such, the one or more inserts 402 may be utilized as shown in FIGS. 4-5 to facilitate more uniform flow velocity proximate the edges of the substrate 125. The inserts 402 may be heated by one or more of the lamps 136, 138, 152, or 154 to facilitate improved temperature control and/or temperature uniformity of the process gases.

In some embodiments, at least some of the process gases exiting the labyrinthine conduit 123 may flow upward towards the lid 106 of the process chamber 100 due to the process gases expanding into the larger volume of the process chamber 100 upon exiting the labyrinthine conduit 123. As such, the cap 602 may be utilized as illustrated in FIG. 6 to control flow characteristics of the process gases. In some embodiments, the cap 602 facilitates flow of the process gas substantially parallel to the substrate surface, as illustrated in FIG. 6. In some embodiments, the cap 602 may be heated by one or more of the lamps 136, 138 to improve temperature control and/or temperature uniformity of the process gases proximate the substrate surface.

Thus, methods and apparatus for controlling temperature and flow characteristics of process gases in a process chamber have been provided herein. The inventive apparatus and methods advantageously improve temperature uniformity and flow characteristics of process gases being flowed across a substrate surface. Such enhanced process gas temperatures and flow uniformity facilitates uniform processing of substrates, such as deposition of a layer atop the substrate surface.

While the foregoing is directed to embodiments of the present invention, other and further embodiments of the invention may be devised without departing from the basic scope thereof.

The invention claimed is:

1. An apparatus for controlling temperature and flow characteristics of a process gas in a process chamber, comprising:
    a gas pre-heat ring configured to be disposed about a substrate and having a labyrinthine conduit disposed therein, wherein the gas preheat ring includes an annular body having a central opening and an upper surface, wherein the labyrinthine conduit comprises a torturous path and has an inlet and outlet to facilitate the flow of the process gas therethrough, wherein the labyrinthine conduit is disposed on the upper surface of the annular body and on one side of the annular body, and wherein the labyrinthine conduit is configured to flow the process gas towards a side of the gas pre-heat ring opposing the outlet and across a surface of the substrate.

2. The apparatus of claim 1, further comprising:
    a flow channel extending from the outlet of the labyrinthine conduit to a side of the gas pre-heat ring opposing the outlet and having a width substantially equal to a width of the substrate.

3. The apparatus of claim 2, further comprising:
    one or more inserts disposed on an upper surface of the gas preheat ring and having inner surfaces that define the flow channel.

4. The apparatus of claim 3, wherein the one or more inserts comprise at least one of quartz, silicon carbide, or graphite coated with silicon carbide.

5. The apparatus of claim 2, further comprising:
    a cap disposed above a central portion of the gas pre-heat ring and defining the flow channel between a lower surface of the cap and an upper surface of the substrate when the gas pre-heat ring is disposed thereabout.

6. The apparatus of claim 5, wherein the cap comprises at least one of quartz, silicon carbide, or graphite coated with silicon carbide.

7. The apparatus of claim 1, wherein the gas pre-heat ring comprise at least one of quartz, silicon carbide, or graphite coated with silicon carbide.

8. An apparatus for processing a semiconductor substrate, comprising:
    a process chamber having a substrate support disposed therein; and
    a gas pre-heat ring disposed about the substrate support and having a labyrinthine conduit disposed therein, wherein the gas preheat ring includes an annular body having a central opening and an upper surface, wherein the labyrinthine conduit comprises a torturous path and has an inlet and outlet to facilitate the flow of a process gas therethrough, wherein the labyrinthine conduit is disposed on the upper surface of the annular body and on one side of the annular body, and wherein the labyrinthine conduit is configured to flow the process gas towards a side of the gas pre-heat ring opposing the outlet and across a surface of the substrate.

9. The apparatus of claim 8, further comprising:
    one or more lamps to provide light energy to the gas pre-heat ring.

10. The apparatus of claim 8, further comprising:
    a flow channel extending from the outlet of the labyrinthine conduit to a side of the gas pre-heat ring opposing the outlet and having a width substantially equal to a width of the substrate.

11. The apparatus of claim 10, further comprising:
    one or more inserts disposed on an upper surface of the gas preheat ring and having inner surfaces that define the flow channel.

12. The apparatus of claim 11, further comprising:
    one or more lamps to provide light energy to the one or more inserts.

13. The apparatus of claim 10, further comprising:
    a cap disposed above a central portion of the gas pre-heat ring and defining the flow channel between a lower surface of the cap and an upper surface of the substrate when the gas pre-heat ring is disposed thereabout.

14. The apparatus of claim 13, further comprising:
    one or more lamps to provide light energy to the cap.

\* \* \* \* \*